US011227945B2

(12) United States Patent
Zundel et al.

(10) Patent No.: US 11,227,945 B2
(45) Date of Patent: *Jan. 18, 2022

(54) TRANSISTOR HAVING AT LEAST ONE TRANSISTOR CELL WITH A FIELD ELECTRODE

(71) Applicant: Infineon Technologies Austria AG, Villach (AT)

(72) Inventors: Markus Zundel, Egmating (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

This patent is subject to a terminal disclaimer.

(21) Appl. No.: 16/895,755

(22) Filed: Jun. 8, 2020

(65) Prior Publication Data

US 2020/0303539 A1    Sep. 24, 2020

Related U.S. Application Data

(60) Continuation of application No. 16/290,204, filed on Mar. 1, 2019, now Pat. No. 10,707,342, which is a (Continued)

(30) Foreign Application Priority Data

Dec. 30, 2015  (DE) .......................... 102015122938.2

(51) Int. Cl.
*H01L 29/78*  (2006.01)
*H01L 29/417*  (2006.01)
(Continued)

(52) U.S. Cl.
CPC ...... *H01L 29/7811* (2013.01); *H01L 23/5226* (2013.01); *H01L 23/53257* (2013.01);
(Continued)

(58) Field of Classification Search
CPC ............... H01L 29/407; H01L 29/1095; H01L 29/4236; H01L 29/7813; H01L 29/66734;
(Continued)

(56) References Cited

U.S. PATENT DOCUMENTS 5,801,417 A    9/1998  Tsang et al.
8,786,012 B2   7/2014  Mauder et al.
(Continued)

FOREIGN PATENT DOCUMENTS

DE   112004002608 B4   12/2015
JP   2009135360 A       6/2009
(Continued)

*Primary Examiner* — Khiem D Nguyen
(74) *Attorney, Agent, or Firm* — Murphy, Bilak & Homiller, PLLC

(57) ABSTRACT

A transistor device includes at least one transistor cell which includes: a source region, a body region and a drift region in a semiconductor body; a gate electrode dielectrically insulated from the body region by a gate dielectric; a field electrode dielectrically insulated from the drift region by a field electrode dielectric; and a contact plug extending from a first surface of the semiconductor body to the field electrode. A portion of the semiconductor body is arranged between the field electrode trench and the first surface of the semiconductor body. The portion of the semiconductor body that is arranged between the field electrode trench and the first surface comprises the body region. The body region directly contacts the upper surface of the field electrode dielectric.

30 Claims, 7 Drawing Sheets

Related U.S. Application Data division of application No. 15/387,706, filed on Dec. 22, 2016, now Pat. No. 10,243,071.

(51) Int. Cl.

| | | |
|---|---|---|
| *H01L 23/522* | (2006.01) | |
| *H01L 23/532* | (2006.01) | |
| *H01L 29/08* | (2006.01) | |
| *H01L 29/10* | (2006.01) | |
| *H01L 29/40* | (2006.01) | |
| *H01L 29/66* | (2006.01) | |

(52) U.S. Cl.
CPC ........ *H01L 23/53266* (2013.01); *H01L 29/08* (2013.01); *H01L 29/1095* (2013.01); *H01L 29/407* (2013.01); *H01L 29/41741* (2013.01); *H01L 29/41766* (2013.01); *H01L 29/66727* (2013.01); *H01L 29/66734* (2013.01); *H01L 29/7813* (2013.01)

(58) Field of Classification Search
CPC ........... H01L 29/41766; H01L 29/0696; H01L 29/0563; H01L 29/7802; H01L 29/408; H01L 29/402; H01L 29/7801; H01L 29/0653; H01L 29/7811; H01L 29/08; H01L 29/41741; H01L 29/66727; H01L 29/772; H01L 29/7848; H01L 29/66348
USPC ........................................................ 257/334
See application file for complete search history.

(56) References Cited

U.S. PATENT DOCUMENTS

| | | | |
|---|---|---|---|
| 9,852,945 B2* | 12/2017 | Meiser | H01L 29/7811 |
| 10,707,342 B2* | 7/2020 | Zundel | H01L 23/53266 |
| 2006/0237816 A1* | 10/2006 | Nakajima | H01L 29/66545 |
| | | | 257/500 |
| 2008/0073707 A1 | 3/2008 | Darwish | |
| 2008/0121986 A1 | 5/2008 | Hshieh | |
| 2009/0140327 A1* | 6/2009 | Hirao | H01L 29/66727 |
| | | | 257/328 |
| 2009/0166720 A1* | 7/2009 | Zundel | H01L 29/402 |
| | | | 257/328 |
| 2010/0078707 A1 | 4/2010 | Haeberlen et al. | |
| 2010/0123188 A1 | 5/2010 | Venkatraman | |
| 2010/0181641 A1 | 7/2010 | Blank | |
| 2012/0319761 A1 | 12/2012 | Zundel | |
| 2013/0082322 A1* | 4/2013 | Weber | H01L 29/872 |
| | | | 257/329 |
| 2013/0137230 A1* | 5/2013 | Blank | H01L 29/7813 |
| | | | 438/270 |
| 2013/0270632 A1 | 10/2013 | Felsl et al. | |
| 2013/0323921 A1 | 12/2013 | Burke et al. | |
| 2014/0084362 A1* | 3/2014 | Schloesser | H01L 29/7803 |
| | | | 257/330 |
| 2014/0117438 A1 | 5/2014 | Meiser et al. | |
| 2014/0284711 A1 | 9/2014 | Katoh et al. | |
| 2015/0279985 A1 | 10/2015 | Philippou et al. | |
| 2016/0149028 A1* | 5/2016 | Jin | H01L 21/2652 |
| | | | 257/329 |
| 2016/0172484 A1 | 6/2016 | Naik et al. | |
| 2016/0181417 A1* | 6/2016 | Kampen | H01L 29/407 |
| | | | 257/331 |
| 2016/0300913 A1* | 10/2016 | Siemieniec | H01L 29/4238 |
| 2017/0104078 A1 | 4/2017 | Laforet et al. | |
| 2017/0236910 A1* | 8/2017 | Laforet | H01L 29/4236 |
| | | | 438/270 |

FOREIGN PATENT DOCUMENTS

| | | |
|---|---|---|
| KR | 20100122280 A | 11/2010 |
| KR | 20150031198 A | 3/2015 |

\* cited by examiner

TRANSISTOR HAVING AT LEAST ONE TRANSISTOR CELL WITH A FIELD ELECTRODE

TECHNICAL FIELD

This disclosure in general relates to a transistor device, in particular a field-effect controlled transistor device, and a method for producing thereof.

BACKGROUND

Field-effect controlled transistors, such as MOSFETs (Metal Oxide Field-Effect Transistors) are widely used in automotive, industrial, or consumer electronic applications for driving loads, converting power, or the like. Such transistors, which are often referred to as power transistors, are available with different voltage blocking capabilities. The "voltage blocking capability" defines the maximum voltage level the transistor can withstand in an off-state (when switched off). The on-resistance $R_{ON}$ of a power transistor is another relevant device parameter. The "on-resistance" is the electrical resistance of the power transistor between its load nodes (drain node and source node) in the on-state (when switched on). Typically, a power transistor includes a plurality of transistor cells that are connected in parallel. Basically, the more transistor cells the power transistor includes the lower is the on-resistance.

There is a need to reduce the on-resistance without increasing the size (the required chip area A) of the semiconductor body (semiconductor chip) in which active areas of the power transistor are integrated. There is therefore a need to reduce the size of the individual transistor cells.

SUMMARY

One embodiment relates to a transistor device with at least one transistor cell. The at least one transistor cell includes a source region, a body region and a drift region in a semiconductor body, a gate electrode, a field electrode, and a contact plug. The gate electrode is dielectrically insulated from the body region by a gate dielectric, the field electrode is dielectrically insulated from the drift region by a field electrode dielectric, and the contact plug extends from a first surface of the semiconductor body to the field electrode and adjoins the source region and the body region.

Another embodiment relates to a method. The method includes epitaxially growing a semiconductor layer on a surface of a semiconductor body, wherein the semiconductor body includes at least one field electrode dielectric, and wherein epitaxially growing the semiconductor layer comprises overgrowing the field electrode dielectric. The method further includes forming a body region and a source region in the semiconductor layer, forming a gate electrode that is dielectrically insulated from the body region by a gate dielectric, and forming a contact plug that extends from a surface of the semiconductor layer to the field electrode and adjoins the source region and the body region.

Another embodiment relates to a transistor device with at least one transistor cell. The at least one transistor cell includes a source region, a body region and a drift region in a semiconductor body, a gate electrode, and a field electrode. The gate electrode is dielectrically insulated from the body region by a gate dielectric, and the field electrode is dielectrically insulated from the drift region by a field electrode dielectric. In a lateral direction of the semiconductor body a shortest distance between the field electrode dielectric and the gate dielectric is smaller than 150 nanometers.

Another embodiment relates to a transistor device with at least one transistor cell. The at least one transistor cell includes a source region, a body region and a drift region in a semiconductor body, a gate electrode, a field electrode, and a contact plug. The gate electrode is dielectrically insulated from the body region by a gate dielectric, the field electrode is dielectrically insulated from the drift region by a field electrode dielectric, and the contact plug extends from a first surface of the semiconductor body to the field electrode and adjoins the source region and the body region. The field electrode and the field electrode dielectric are disposed in a field electrode trench that vertically extends into the semiconductor body. A portion of the semiconductor body is arranged between the field electrode trench and the first surface of the semiconductor body. The portion of the semiconductor body that is arranged between the field electrode trench and the first surface comprises the body region. The body region directly contacts the upper surface of the field electrode dielectric.

Another embodiment relates to a transistor device with at least one transistor cell. The at least one transistor cell includes a source region, a body region and a drift region in a semiconductor body, a gate electrode, and a field electrode. The gate electrode is dielectrically insulated from the body region by a gate dielectric, and the field electrode is dielectrically insulated from the drift region by a field electrode dielectric. In a lateral direction of the semiconductor body a shortest distance between the field electrode dielectric and the gate dielectric is smaller than 150 nanometers. The field electrode and the field electrode dielectric are disposed in a field electrode trench that vertically extends into the semiconductor body. A portion of the semiconductor body is arranged between the field electrode trench and a first surface of the semiconductor body. The portion of the semiconductor body that is arranged between the field electrode trench and the first surface comprises the body region. The body region directly contacts the upper surface of the field electrode dielectric.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings, the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
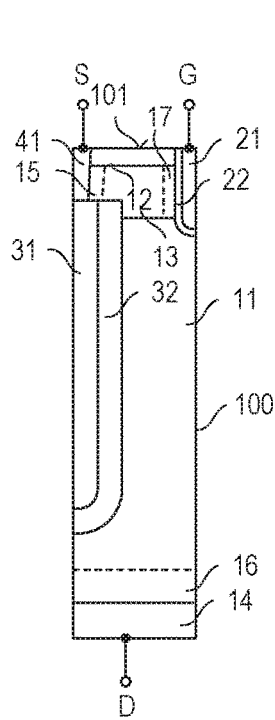
FIG. 1 shows a vertical cross sectional view of one transistor cell of a transistor device, according to an embodiment.

FIG. 1 shows a vertical cross sectional view of a transistor device according to one example. In particular, FIG. 1 shows a vertical cross sectional view of one transistor cell of a transistor device, in particular, a field-effect controlled transistor device. Referring to FIG. 1, the transistor cell includes a drift region 11, a source region 12, and a body region 13 separating the drift region 11 from the source region 12. The drift region 11, the source region 12, and the body region 13, which may be referred to as active device regions, are doped semiconductor regions that are arranged in a semiconductor body 100. A doping type of the body region 13 is complementary to a doping type of the drift region 11 so that a pn-junction is formed between the body region 13 and the drift region 11. The semiconductor body 100 may include a conventional semiconductor material such as, for example, silicon (Si), silicon carbide (SiC), gallium arsenide (GaAs), gallium nitride (GaN), or the like.

Referring to FIG. 1, a gate electrode 21 is arranged adjacent the body region 13 and dielectrically insulated from the body region 13 by a gate dielectric 22. The gate electrode 21 may include a conventional gate electrode material such as, for example, a highly doped polycrystalline semiconductor material, a metal, a metal alloy, or a metal compound. For example, the highly doped polycrystalline semiconductor material is polysilicon. The gate dielectric 22 may include a conventional gate dielectric material such as, for example, an oxide, a nitride, or the like. In the example shown in FIG. 1, the gate electrode 21 is a trench electrode. That is, the gate electrode 21 is arranged in a trench that extends from a first surface 101 of the semiconductor body 100 into the semiconductor body 100. In particular, this trench extends through the source region 12 and the body region 13 into the drift region 11. The gate electrode 21 is dielectrically insulated from each of these device regions by the gate dielectric 22.

Referring to FIG. 1, the transistor cell further includes a field electrode 31. The field electrode 31 is adjacent the drift region 11 and dielectrically insulated from the drift region 11 by a field electrode dielectric 32. The field electrode 31 may include a conventional field electrode material such as, for example, a highly doped polycrystalline semiconductor material, a metal, a metal alloy, or a metal compound. The field electrode dielectric 32 may include a conventional field electrode dielectric material such as, for example, an oxide, a nitride, or the like. According to one example, the field electrode dielectric 32 includes a void that may be filled with a gas.

Referring to FIG. 1, the transistor cell further includes a contact plug 41. The contact plug 41 extends from the first surface 101 to the field electrode 31 and adjoins the source region 12 and the body region 13 so that the contact plug 41 is electrically connected to the field electrode 31, the source region 12 and the body region 13. Optionally, the body region 13 includes a contact region 15. This contact region 15 is more highly doped than other regions of the body regions 13 and adjoins the contact plug 41. According to one example, a doping concentration of the contact region 15 is such that the body region 13 is ohmically connected to the contact plug 41 via the contact region. The contact plug 41 is connected to a source node S, which is only schematically illustrated in FIG. 1, and the gate electrode 21 is connected to a gate node G, which is only schematically illustrated in FIG. 1.

The contact plug includes an electrically conducting material, for example, a metal or a highly doped polycrystalline semiconductor material such as polysilicon. According to one example, the contact plug 41 includes an electrically conducting barrier layer on the field electrode 31 and the semiconductor regions (the source region 12, the body region 13 and/or the optional contact region 15) and another electrically conducting material on the barrier layer. According to one example, the barrier layer includes one of titanium (Ti) and titanium nitride (TiN), and the other electrically conducting material includes one of a metal such as tungsten (W), and a highly doped polycrystalline semiconductor material.

Furthermore, the transistor cell includes a drain region 14. The drain region 14 is separated from the body region 12 by the drift region 11. Optionally, a field-stop region 16 is arranged between the drift region 11 and the drain region 14. The field-stop region 16 has the same doping type as the drift region 11 but is more highly doped than the drift region 11. For example, a doping concentration of the source region 13 and the body contact region 15 is higher than 1E19 cm$^{-3}$, a doping concentration of the body region is selected from between 1E16 cm$^{-3}$ and 1E18 cm$^{-3}$, a doping concentration of the drift region is selected from between 1E15 cm$^{-3}$ and 1E18 cm$^{-3}$, and a doping concentration of the drain region 14 is higher than 1E18 cm$^{-3}$.

The transistor device can be implemented as an n-type transistor device or a p-type transistor device. The type of the transistor device is defined by the doping type of the source region 12, wherein a doping type of the source region 12 is complementary to the doping type of the body region 13, and equals a doping type of the drift region 11. In an n-type transistor device, the source region 12 is n-doped, the body region 13 is p-doped, and the drift region 11 is n-doped. In a p-type transistor device, doping types of the individual device regions are complementary to the doping types of the corresponding regions in a p-type device. That is, the source region 12 is p-doped, the body region 13 is n-doped, and the drift region 11 is p-doped. Furthermore, the transistor device can be implemented as a MOSFET (Metal Oxide Semiconductor Field-Effect Transistor), or as an IGBT. In a MOSFET, the drain region 14 has the same doping type as the source region 11, and in an IGBT, the drain region 14 has a doping type complementary to the doping type of the source region 12. Furthermore, the transistor device can be implemented as an enhancement device (normally-off device) or a depletion device (normally-on device). In an enhancement device, the body region 13 adjoins the gate dielectric 22. In a depletion device, there is a channel region 17 (illustrated in dashed lines in FIG. 1) of the same doping type as the source region 12 and the drift region 11 between the body region 13 and the gate dielectric. This channel region 17 extends between the body region 13 and the gate dielectric 22 along the gate dielectric 22 from the source region 12 to the drift region 11.

The transistor device shown in FIG. 1 can be switched on and off by applying a suitable drive voltage (gate-source voltage) between the gate node G and the source node S. The transistor device is in the on-state when the drive voltage is such that there is a conducting channel in the body region 13 between the source region 12 and the drift region 11. In an enhancement device, there is a conducting channel in the body region 13 when the drive voltage generates an inversion channel in the body region 13 along the gate dielectric 22. For example, in an n-type enhancement device, a gate-source voltage to be applied between the gate node G and the source node S in order to generate such inversion channel is a positive voltage higher than a threshold voltage. In a depletion device, there is already a conducting channel when the gate-source voltage is zero. The transistor device is in the off-state when there is no conducting channel in the body region 13 between the source region 12 and the drift region 11. An enhancement device is in the off-state when the inversion channel is interrupted, that is, when the drive voltage is below the threshold voltage. A depletion device is in the off-state, when the gate-source voltage is such that the channel region 17 is completely depleted. For example, an n-type depletion device is in the off-state when the gate-source voltage is a negative voltage that is below a threshold voltage of the transistor device.

In the on-state, a current can flow between the drain region 14, which is connected to a drain node D, and the source node S when a voltage is applied between the drain node D and the source node S. In the off-state, the transistor device is capable to prevent a current flow between the drain node D and the source node S when the voltage applied between the drain node D and the source node S is below a voltage blocking capability of the transistor device. In the off-state, when a voltage is applied between the drain node and the source node that reverse biases the pn-junction between the drift region 11 and the body region 13, a depletion region (space charge region) expands in the drift region 11 beginning at the pn-junction between the drift region 11 and the body region 13. For example, in an n-type transistor device, the pn-junction is reverse biased when a positive voltage is applied between the drain node D and the source node S. The expansion of this depletion region is associated with an ionization of dopant atoms in the drift region 11. Those ionized dopant atoms have corresponding counter-charges either in the body region 13 or in the field electrode 31, which is coupled to the source S. By virtue of the field electrode 31, the drift region 11 can be more highly doped than a conventional transistor device that does not include a field electrode. Thus, an on-resistance of a transistor device with a field electrode is lower than an on-resistance of a comparable transistor device without field electrode. The on-resistance is the electrical resistance of the transistor device between the drain node D and the source node S in the on-state of the transistor device.

By implementing the transistor device such that the contact plug 41 is arranged between the field electrode 31 and the first surface 101 the device cell can be implemented to have a small lateral dimension. The "lateral dimension" of the device cell is a dimension in a direction x parallel to the first surface 101 of the semiconductor body 100. The source region 12 and the drain region 14 are spaced apart in a vertical direction of the semiconductor body 100, which is a direction perpendicular to the first surface 101. Implementing the transistor cell with a small lateral size means implementing a transistor device with several transistor cells with a low pitch. This is explained with reference to FIG. 2 below.

Figure 2:
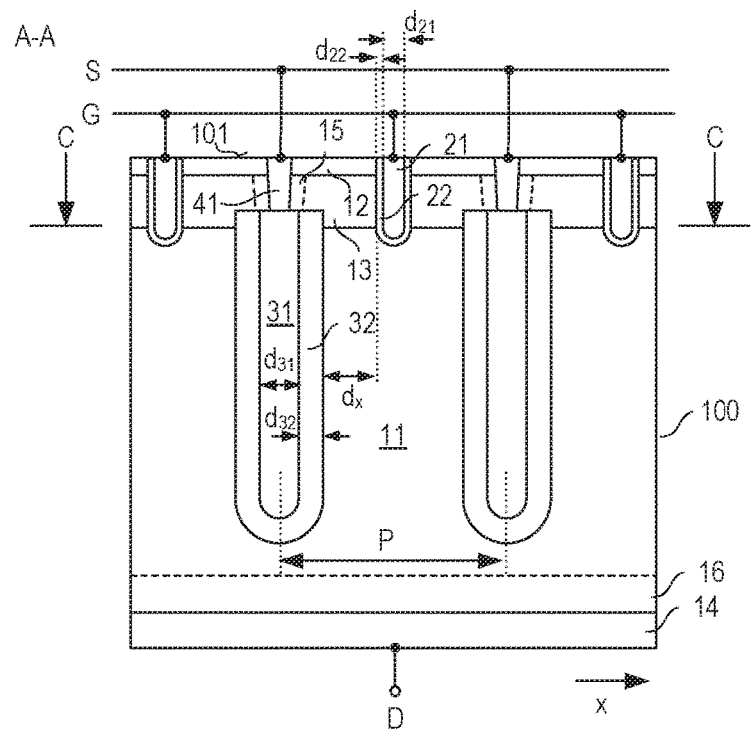
FIG. 2 shows a vertical cross sectional view of a transistor device with a plurality of transistor cells, according to an embodiment.

FIG. 2 shows a vertical cross sectional view of one section of a transistor device that includes several transistor cells. The individual transistor cells are connected in parallel by having the gate electrodes 21 connected to a common gate node G, and by having the contact plugs 41 connected to a common source node S. In the example shown in FIG. 2, the individual transistor cells share the drift region 11 and the drain region 14 (and the optional field-stop region 16) so that the individual transistor cells are connected to the drain node D via the common drain region 14.

Referring to the above, by virtue of the contact plug 41 being arranged between the field electrodes 31 and the first surface 101, the individual transistor cells can be implemented with small lateral dimensions or, with other words, with a small pitch. In a transistor device, the "pitch" is the distance between identical device features in neighbouring transistor cells. Just for the purpose of explanation, in FIG. 2 the pitch P is drawn as the center to center distance of two neighbouring field electrodes 31. The lateral dimension of one transistor cell is equal to half the pitch P (P/2). In the example shown in FIG. 2, the pitch P is given by $$P = d_{31} + 2 \cdot d_{32} + 2 \cdot d_{22} + d_{21} + 2 \cdot d_x \quad (1),$$

where $d_{31}$ is the width of one field electrode 31 in the lateral direction x, $d_{32}$ is the thickness of the field electrode dielectric 32 in the lateral direction x, $d_{21}$ is the width of the gate electrode 21 in the lateral direction x, and $d_{22}$ is the thickness of the gate dielectric 22 in the lateral direction x. $d_x$ is the shortest distance between the gate dielectric 22 and the field electrode dielectric 32 in the lateral direction x. In the embodiment shown in FIG. 2, where the gate electrode 21 and the field electrode 31 of one transistor cell overlap in the vertical direction of the semiconductor body 100, the distance $d_x$ is required to allow the current to flow from the source region 12 through the conducting channel along the gate dielectric 22 into the drift region 11. This distance $d_x$, however, can be relatively small. According to one example, $d_x$ is smaller than 150 nanometers, smaller than 100 nanometers, or even smaller than 50 nanometers. According to one example, $d_x$ is selected from between 30 nanometers (nm) and 70 nanometers. According to one example, $d_x$ is about 50 nanometers. With the transistor cell design shown in FIGS. 1 and 2, a pitch P smaller than one micrometer (μm) can be obtained in a transistor device with a voltage blocking capability of several 10V, such as, for example, about 40V. For example, $d_{31}$ is between 100 nm and 200 nm, $d_{32}$=150 nm, $d_{21}$=120 nm, $d_{22}$=40 nm. As can be seen from equation (1), the pitch P is independent of a lateral width of the contact plug 41. This applies if the lateral width in the direction x of the contact plug 41 is smaller than the lateral width of one field electrode structure, wherein one field electrode structure includes one field electrode 31 and the field electrode dielectric 32 insulating the field electrode 31 from the drift region 11.

The gate dielectric 21 and the field electrode dielectric 32 do not necessarily overlap in the vertical direction of the semiconductor body 100 (as will be explained with reference to FIG. 9 below). If the gate dielectric 21 and the field electrode dielectric 32 do not overlap in the vertical direction, $d_x$ is the shortest distance between the position in the lateral direction x of a vertical interface between the field electrode dielectric 32 and the semiconductor body 100 and the position in the lateral direction x of a vertical interface between the gate dielectric 22 and the semiconductor body 100. The "vertical interface" is an interface that extends in the vertical direction of the semiconductor body 100.

Figure 3:
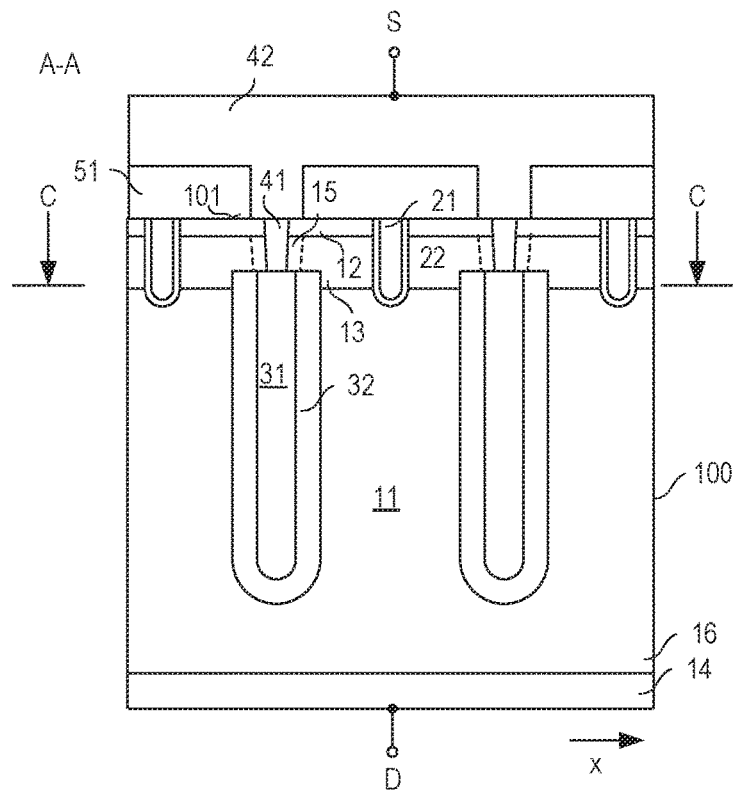
FIG. 3 shows a vertical cross sectional view of a transistor device with a plurality transistor cells, according to an embodiment.

In FIG. 2, connections between the contact plugs 41 of the individual transistor cells (wherein two neighbouring transistor cells share one contact plug 41 in this example) and the source node S are only schematically illustrated. FIG. 3 shows one example of how these connections can be implemented. Referring to FIG. 3, the transistor device includes a source electrode 42 that is electrically connected to the individual contact plugs 41 and electrically insulated from the gate electrode 21 by an insulation layer 51. The source electrode 42 is electrically connected to the source node S or forms the source node S of the transistor device. The source electrode 42 includes an electrically conductive material such as, for example, a highly doped polycrystalline semiconductor material, a metal, a metal alloy, or a metal compound. For example, the insulation layer 51 is an oxide, a nitride, or the like. According to one example, the insulation layer 51 includes a layer stack with two or more layers of different electrically insulating materials.

Figure 4:
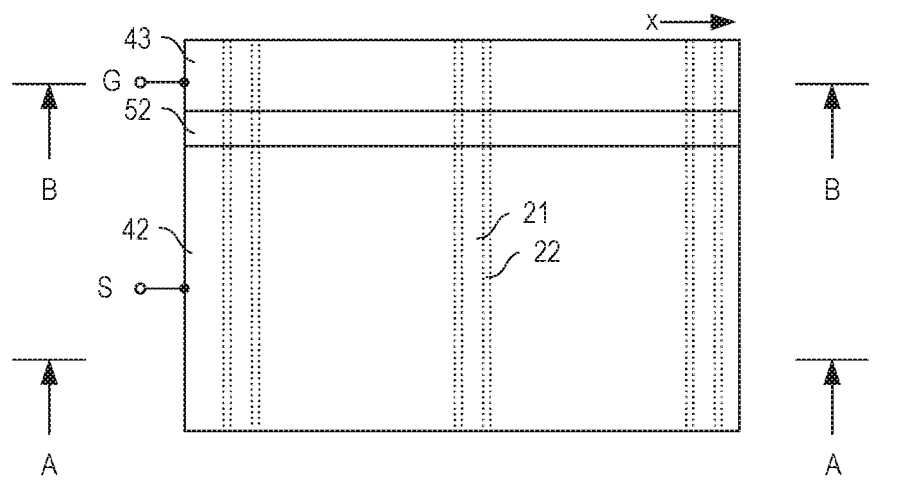
FIG. 4 shows a horizontal cross sectional view of one section of a transistor device, according to an embodiment.

FIG. 4 shows a top view of a section of a transistor device of the type shown in FIG. 3. In particular, FIG. 4 shows a top view of the source electrode 42. A position of the gate electrodes 21 and the gate dielectrics 22 below the source electrode 42 are illustrated in dotted lines in FIG. 4. In this example, the gate electrodes 21 are elongated in a lateral direction y perpendicular to the lateral direction x shown in FIGS. 2 and 3. In this lateral direction y, the gate electrodes 21 extend beyond the source electrode 42. In a region where the gate electrodes 21 are not covered by the source electrode 42 the gate electrodes 21 are electrically connected to a gate connection electrode 43 that is spaced apart from the source electrode 42 in the lateral direction y. A further electrically insulating layer 52 can be arranged between the source electrode 42 and the gate connection electrode 43.

Figure 5:
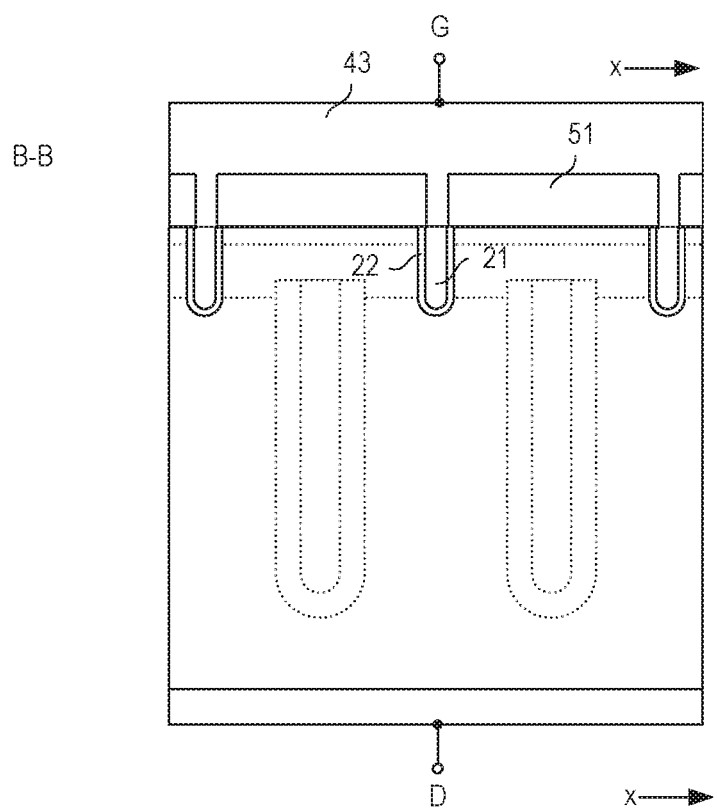
FIG. 5 shows a vertical cross sectional view in a section plane B-B of the transistor device shown in FIG. 4, according to an embodiment.

FIG. 5 shows a vertical cross sectional view of a transistor device of the type shown in FIG. 4 in a vertical section plane B-B that cuts through the gate connection electrode 43. As can be seen from FIG. 5, the insulation layer 51 that electrically insulates the source electrode 42 from the gate electrodes 21 (see FIG. 3) electrically insulates the gate connection electrode 43 from the semiconductor body 100. The transistor device may include source and body regions and field electrodes and field electrode dielectrics below the gate electrode 43. However, it is also possible to omit these device features, in particular the source region, below the gate connection electrode 43. For this reason, these device features are illustrated in dotted lines in FIG. 5. According to one example (not shown) there is a doped region of the same doping type as the body region 13 and complementary to the doping type of the drift region 11 that extends from the first surface 101 to below the trenches with the gate electrodes 21 and the gate dielectrics 22.

Figure 6:
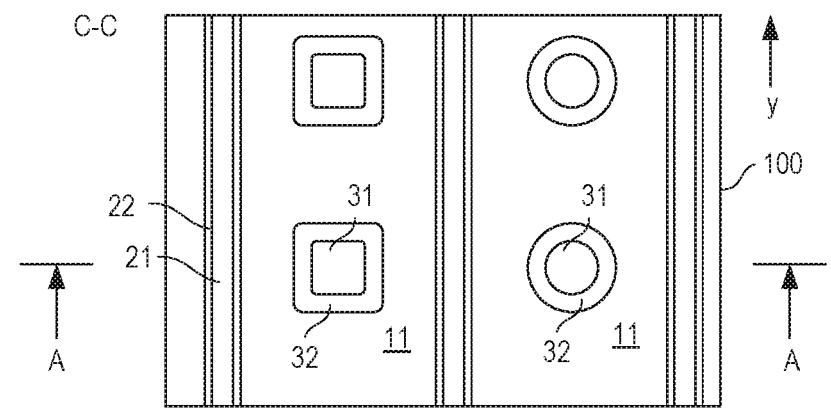
FIG. 6 shows one example of a horizontal cross sectional view of a transistor device of the type shown in FIGS. 1 and 2, according to an embodiment.

FIG. 6 shows a horizontal cross sectional view of one example of a transistor device of the type shown in FIGS. 2 and 3. FIG. 6 shows the transistor device in a horizontal section plane C-C shown in FIGS. 1 and 2. In the transistor device shown in FIG. 6, the gate electrodes 21 are elongated in the lateral direction y, as already explained with reference to FIG. 4 above. In the example shown in FIG. 6, the field electrode structures, which each include a field electrode 31 and a field electrode dielectric 32, are needle shaped, and there are several field electrode structures spaced apart from each other in the lateral direction y. In context with the field electrode structure, but also in context with trenches that accommodate the field electrode structures, "needle shaped" means that lateral dimensions, which are dimensions in a plane parallel to the first surface 101, are smaller than a vertical dimension, which is a dimension in a direction perpendicular to the first surface 101. In the horizontal plane C-C, the field electrode structures may have one of several possible cross sectional shapes. Just for the purpose of explanation, two different shapes are shown in FIG. 6, namely a circular shape, and a rectangular shape with rounded corners. This, however, is just an example. Other cross sectional shapes such as an elliptical shape, a hexagonal shape or other polygonal shapes may be used as well.

Figure 7:
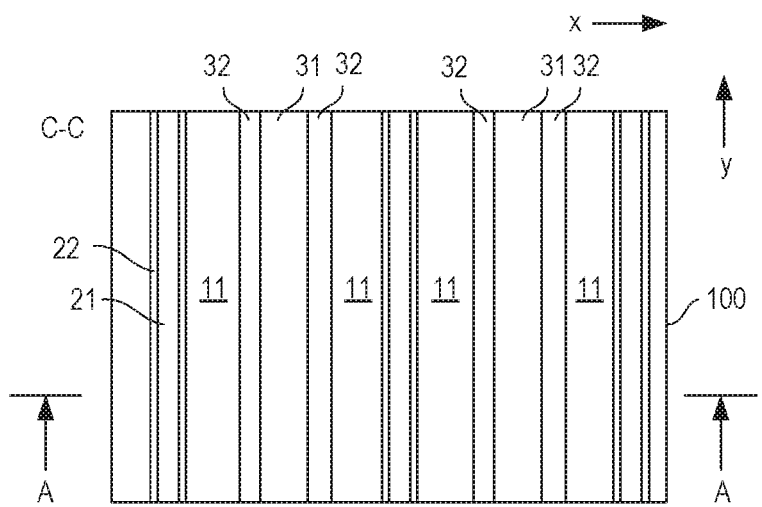
FIG. 7 shows one example of a horizontal cross sectional view of a transistor device of the type shown in FIGS. 1 and 2, according to an embodiment.
Figure 8:
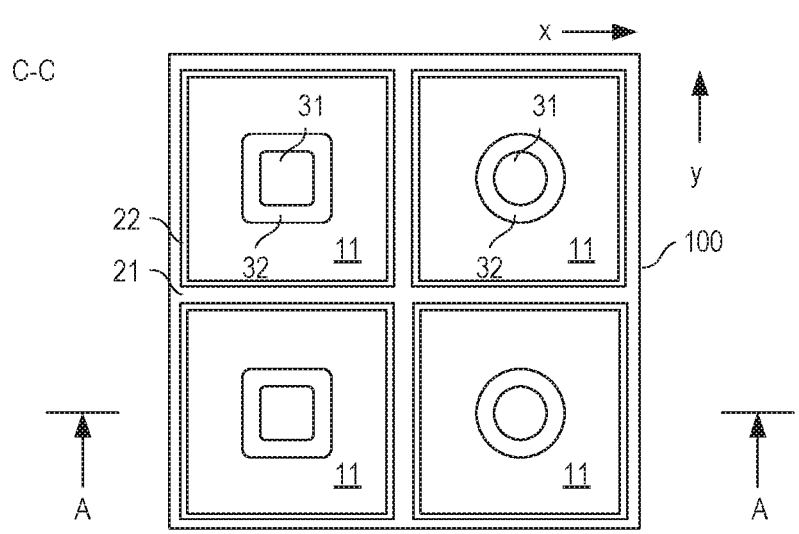
FIG. 8 shows one example of a horizontal cross sectional view of a transistor device of the type shown in FIGS. 1 and 2, according to an embodiment.

FIG. 7 shows a horizontal cross sectional view of another example of a transistor device of the type shown in FIGS. 2 and 3. In this transistor device, the gate electrodes 21 and the field electrodes 31 are elongated in the lateral direction y. According to yet another example, shown in FIG. 8, the field electrode structures are needle shaped, as explained with reference to FIG. 6, and the gate electrode 21 has a grid-shape. The grid-shaped gate electrode 21 can be considered to include gate electrode sections that are elongated in the first lateral direction x, and gate electrode sections that are elongated in the second lateral direction y. This grid-shaped gate electrode 21 can be connected to the gate connection electrode 43 in the same way as elongated gate electrodes 21 shown in FIG. 4. That is, the grid-shaped gate electrode 21 shown in FIG. 8 may extend beyond the source electrode 42 in the lateral direction y.

Figure 9:
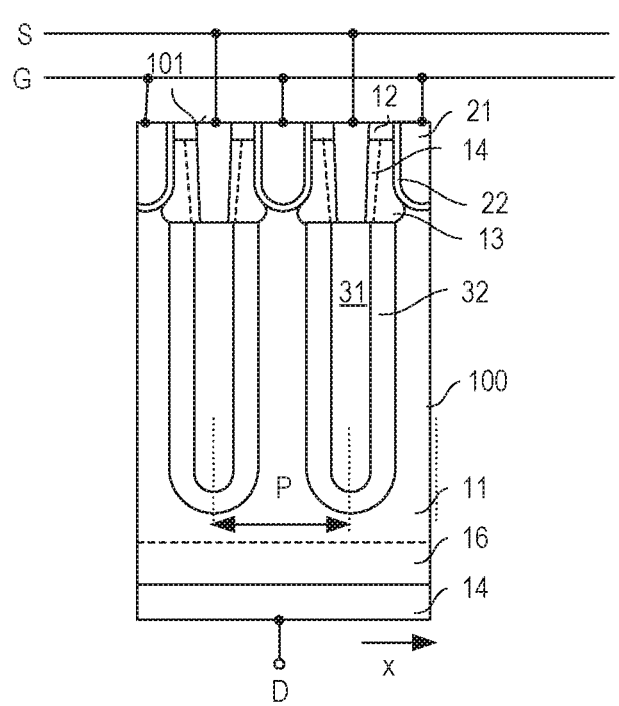
FIG. 9 shows a vertical cross sectional view of one section of a transistor device, according to another example, according to an embodiment.

FIG. 9 shows a vertical cross sectional view of a transistor device according to another example. The transistor device shown in FIG. 9 is different from the transistor devices shown in FIGS. 2 and 3 in that there is no overlap between the gate electrode 21 and the field electrode 31 in the vertical direction (which is a direction perpendicular to the first surface 101). That is, a vertical length of the gate structures, wherein each gate structure includes one gate electrode 21 and the corresponding gate dielectric 22, is smaller than a distance between the field electrode 31 and the first surface 101. The "vertical length" of one gate structure is the dimension of one gate structure in the vertical direction z of the semiconductor body 100. By avoiding a vertical overlap between the gate structures and the field electrode structures, the field electrode structures and the gate structures can overlap in the lateral direction x, so that the pitch P can be smaller than in the transistor devices shown in FIGS. 2 and 3. "To overlap in the lateral direction x" means that at least sections of the gate dielectric 22 are arranged above the field electrode dielectric 32. According to one example, the gate electrode 21 overlaps the field electrode dielectric 32 or even the field electrode 31 in the lateral direction x. In particular, a distance $d_x$ in the lateral direction x between the gate dielectric 22 and the field electrode dielectric 32 is not required. In particular, in this transistor device, the pitch P is given by, $$P < d_{31} + 2 \cdot d_{32} + 2 \cdot d_{22} + d_{21} \quad (2).$$

Everything else the has been explained above with regard to the transistor devices shown in FIGS. 2 and 3 applies to the transistor device shown in FIG. 9 accordingly.

FIGS. 10A-10H show one example of a method for producing a transistor device of one of the types explained above. FIGS. 10A-10H show vertical cross sectional views of the transistor device during or after process sequences for forming the transistor device. FIGS. 10A-10H illustrate a manufacturing process of a transistor device of the type shown in FIGS. 2 and 3 where there is a lateral distance between the gate electrode structures 21, 22 and the field electrode structures 31,32. However, the process sequences explained with reference to FIGS. 10A-10H apply to a transistor device of the type shown in FIG. 9 accordingly.

Figure 10A:
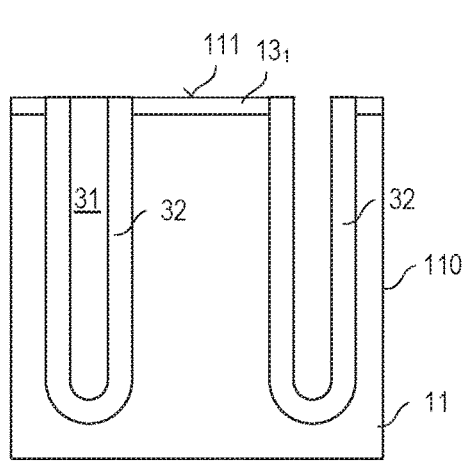
FIGS. 10A-10H illustrate one example of a method for forming a transistor device of the type shown in FIGS. 1 and 2, according to an embodiment.

Referring to FIG. 10A, processing begins with providing a semiconductor layer 110 that either includes one or more field electrode structures, with each field electrode structure including a field electrode 31 and field electrode dielectric 32, or one or more field electrode dielectrics. A field electrode structure is shown on the left side of FIG. 10A, and a field electrode dielectric 32 on sidewalls and a bottom of a trench and leaving a residual trench is shown on the right side of FIG. 10A. The field electrode structure or the field electrode dielectric extends from a first surface 111 of the semiconductor layer 110 into the semiconductor layer 110. The semiconductor layer 110 includes the drift region 11. Optionally the semiconductor layer 110 includes a first section $13_1$ of the body region 13. This first section $13_1$ adjoins the first surface 101 and forms a pn-junction with the drift region 11.

According to one example, the semiconductor layer 110 is an epitaxial layer grown on a semiconductor substrate, wherein the semiconductor substrate or parts of the semiconductor substrate may form the drain region (not shown) of the finished transistor device. In this case, the drift region is formed during the epitaxial growth process. The first section $13_1$ may also be formed in the epitaxial growth process. According to another example, forming the first section $13_1$ includes introducing dopant atoms via the surface 111 into the semiconductor layer 110 after the epitaxial process. According to yet another example, the first section $13_1$ has not yet been produced at the stage shown in FIG. 10A.

According to another example, the semiconductor layer 110 is a semiconductor substrate having a basic doping with a doping concentration corresponding to the doping concentration of the drift region 11. In this substrate, the drain region (not shown) may be formed by introducing dopant atoms via a second surface of the first surface 101. The first section $13_1$ of the body region 13 may be formed by introducing dopant atoms via the first surface 101. According to another example, the first section $13_1$ has not yet been produced at the stage shown in FIG. 10A. An example, of how the field electrode structures can be formed in the semiconductor layer 110 is explained with reference to FIGS. 11A-11D herein below.

Figure 10B:
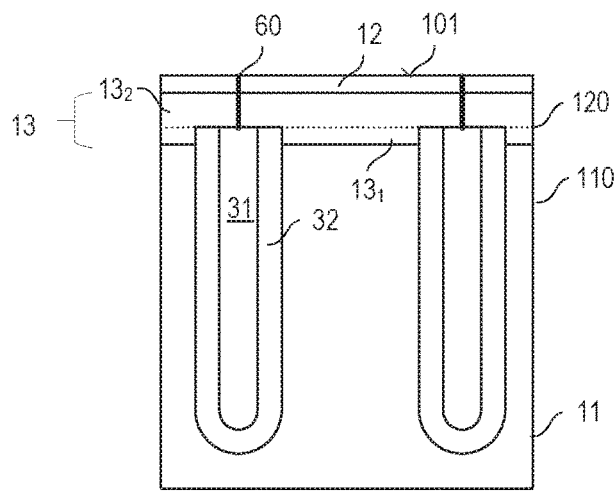

The semiconductor layer 110 shown in FIG. 10A will be referred to as first semiconductor layer 110 in the following. Referring to FIG. 10B, the method includes forming a second semiconductor layer 120 on the first surface 111 of the first semiconductor layer 110. Forming the second semiconductor layer 120 may include a selective epitaxial growth process in which the second semiconductor layer 120 is grown on mesa regions of the first semiconductor layer 110. A "mesa region" of the semiconductor layer 110 is a semiconductor region between two neighbouring field electrode structures 31, 32. If the field electrode 31 has been formed before the epitaxial process, as shown on the left side of FIG. 10A, the epitaxial layer 120 laterally overgrows the field electrode structure with the field electrode dielectric 32 and the field electrode 31. If only the field electrode dielectric has been formed before the epitaxial process, as shown on the right side in FIG. 10A, the field electrode 31 is formed by the epitaxial process. In this case, the second layer 120 grows on the mesa region in a monocrystalline fashion and laterally overgrows those regions of the field electrode dielectric 32 that adjoin the surface 111. Furthermore, on the field electrode dielectric 32 in the trench semiconductor material grows in a polycrystalline fashion and forms the field electrode 32.

According to one example, the second epitaxial layer 120 is doped during the growth process so as to form a second section $13_2$ of the body region 13 and the source region 12 adjoining the body region 13. According to another example, the second epitaxial layer 120 is doped during the growth process so as to form a second section $13_2$ of the body region 13, and the source region 12 is formed by introducing dopant atoms into the second semiconductor layer 120 after the epitaxial process. The first semiconductor layer 110, the second semiconductor layer 120, and an optional substrates (not shown) on which the first layer 110 can be formed form the semiconductor body 100 explained before.

If the second semiconductor layer 120 is doped during the growth process, dopants atoms may diffuse from the second layer 120 into the first layer 110 and form the first body region section $13_1$. In this case, the first body region section $13_1$ is formed when forming the second semiconductor layer 120.

Forming the second epitaxial layer 120 to laterally overgrow the field electrode structure or the field electrode dielectric 32 may result in seams or even voids in the second semiconductor layer 120 above the field electrode 31. These seams or voids are schematically illustrated by black lines labeled with 60 in FIG. 10B.

Figure 10C:
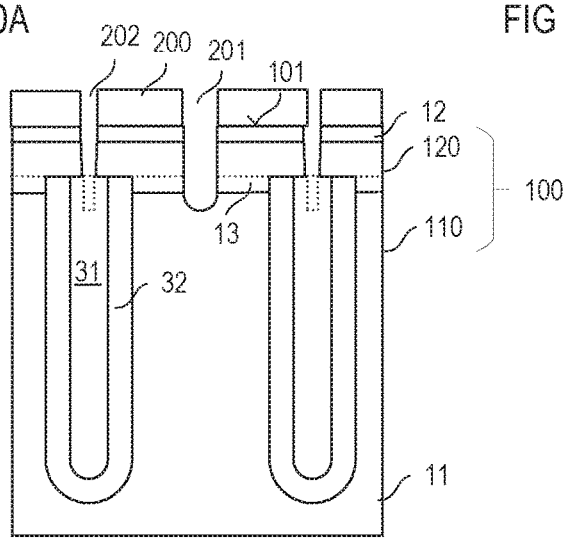

Referring to FIG. 10C, the method further includes forming first trenches 201 that extend through the source region 12 and the body region 13 into the drift region 11. The method further includes forming second trenches 202 that extend from the first surface 101 down to the field electrodes 31. The first trenches 201 and the second trenches 202 can be formed in the same process sequence. Forming these trenches 201, 202 may include an etching process using an edge mask 200. According to one example, the etching process is an anisotropic etching process. According to one example, the etching process is selected such that it etches the semiconductor material of the semiconductor body 100 selectively relative to the material of the field electrodes 31. In this case, etching the second trenches 202 automatically stops as soon as the second trenches 202 have been etched down to the field electrodes 31, while the first trenches 201 can be etched deeper into the semiconductor body 100 than the second trenches 202. The etching process, however, is not necessarily selective. According to another example the etching process also etches the material of the field electrodes 31 so that the second trenches 202 extend into the field electrodes 32. This is illustrated in dotted lines in FIG. 10C. When forming the second trenches 202 seams or voids, which were possibly formed when forming the second semiconductor layer 120, are removed.

Figure 10D:
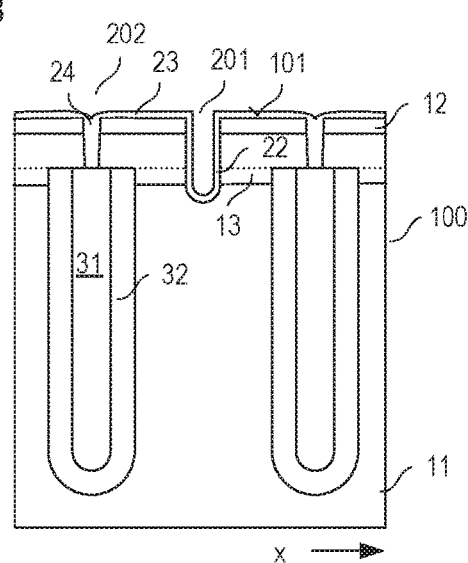

Referring to FIG. 10D, the method further includes forming the gate dielectric 22 in the first trenches 201. According to one example, the gate dielectric 22 is formed by thermally oxidizing the semiconductor body 100 in those regions that adjoin sidewalls and a bottom of each first trench 201. According to another example, forming the gate dielectric 22 includes depositing a gate dielectric layer on sidewalls and the bottom of each first trench 201. When forming the gate dielectric 22 a dielectric layer 23 is formed on the first surface 101, and another dielectric layer 24 is formed in the second trenches 22. According to one example, a width of the second trench 202 in the lateral direction x is adapted to a thickness of the dielectric layer 24 such that the dielectric layer 24 substantially fills the second trench 202. However, the gate dielectric 22 does not completely fill the first trench 201, so that a residual trench remains after forming the gate dielectric 22.

Figure 10E:
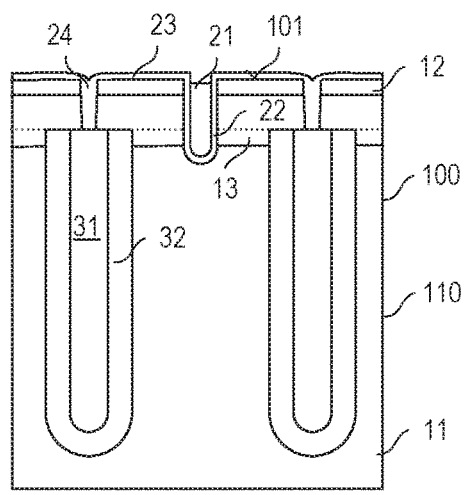

Referring to FIG. 10E, the method further includes forming a gate electrode 21 in the first trenches 201. Forming the gate electrode 21 may include depositing an electrode layer that completely fills the first trenches 201 and covers the dielectric layer 21 on the first surface 101, and etching back the electrode layer so as to uncover the dielectric layer 23. The electrode layer remains in the first trenches 201, so as to form the gate electrodes 21. It should be noted that one contiguous gate electrode 21 is formed in case there is only one first trench 201 that is grid-shaped, so as to form a grid-shaped gate electrode.

Figure 10F:
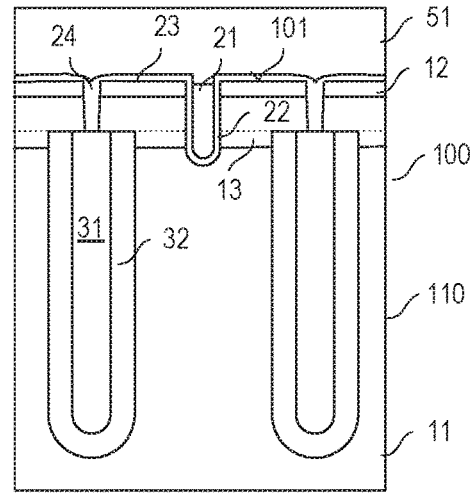

Referring to FIG. 10F, the method further includes forming an insulation layer 51 on the dielectric layer 23 and the gate electrode 21. According to one example, the insulation layer 51 includes at least one of USG (undoped silicate glass) and BPSG (boron and phosphorous doped silicate glass). According to one example, the insulation layer 51 includes a layer stack with at least one USG layer and at least one BPSG layer.

Figure 10G:
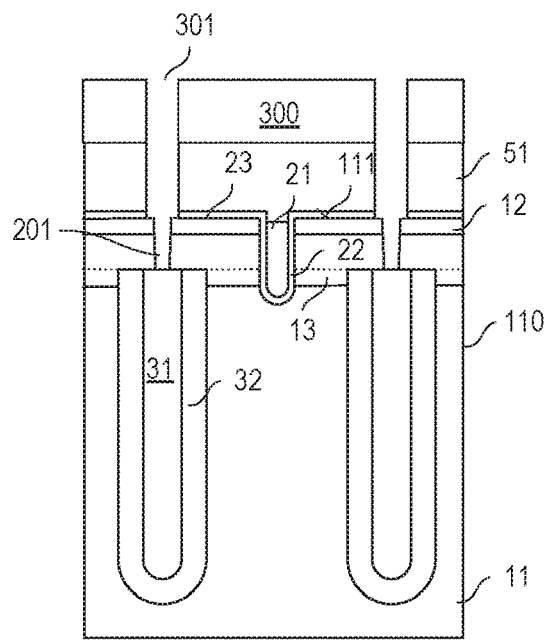

Referring to FIG. 10G, contact holes are formed in the insulation layer 51 and the dielectric layer 24 is removed from above the field electrodes 31 so that there are contact holes 301 that extend through the insulation layer 51 down to the field electrodes 31. Forming these contact holes 301 may include an etching process using an etch mask 301. According to one example, the etching process is selected such that it anisotropically etches the insulation layer 51 and etches the material of the gate dielectric 22 and the dielectric layer 24, respectively, selectively relative to the semiconductor material of the semiconductor body 100. By this, the etching process removes the dielectric layer 24 in the second trenches 202 but does not etch or only slightly etch the semiconductor material adjoining the dielectric layer 24.

Figure 10H:
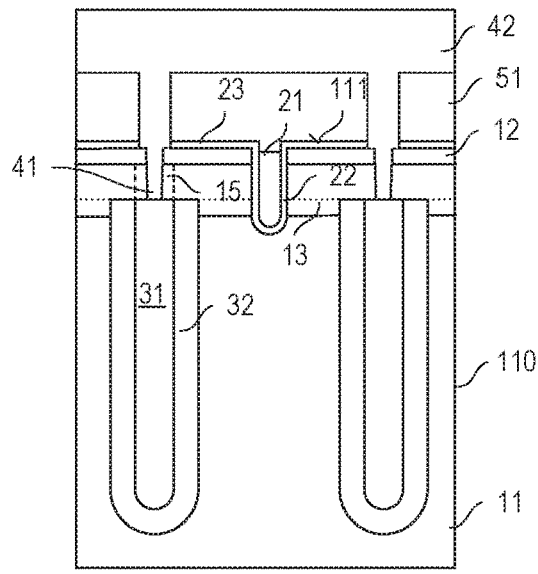

Referring to FIG. 10H, the method further includes forming the source electrode 42 and the contact plug 41. Forming the source electrode 42 and the contact plug 41 may include filling the contact holes 301 with an electrically conducting material so that the contact plug 41 is electrically connected to the field electrodes 31 and adjoins the source region 12 and the body region 13 along sidewalls of the former second trenches 202. According to one example, forming the contact plug 41 includes forming a barrier layer (as explained above) on the bottom and at least one those sidewall sections of the contact hole 301 that adjoin the semiconductor body 100, and filling a trench that remains after forming the barrier layer with another electrically conducting material. Before the source electrode 42 and the contact plug 41 are formed the body contact regions 15 (illustrated in dashed lines in FIG. 10H) may be formed in the body region 13. Forming these contact regions 15 may including implanting dopant atoms via the second trench 202 into the body region 13. In this process dopant atoms may also be implanted into the source region 12 along sidewalls of the second trench 202. According to one example, the source region 12 is produced to have a doping concentration that is at least 3 times the doping concentration of the contact regions 15. Thus, dopant atoms introduced into the source region 12 in this implantation process neither change the doping type of the source region nor significantly reduce the effective doping concentration of the source region 12 in a section adjoining the sidewall of the second trench 202. Like the contact region 15, the source region 12 is ohmically connected to the contact plug 41.

In the transistor device shown in FIG. 10H, the insulation layer 51 was formed on the dielectric layer 23. This, however, is only an example. According to another example, the dielectric layer 23 is removed before forming the insulation layer 51.

In the method explained with reference to FIGS. 10A-10H the first trenches 201, which accommodate the gate electrodes 21 and the gate dielectrics 22 are etched in the same process. In this case, the second trenches 202 are at least partially filled with a dielectric when the gate dielectric 22 is formed, and this dielectric is removed from the second trenches in the etching process shown in FIG. 10G. According to another example, the first trenches 201 and the second trenches 202 are etched in different processes. For example, only the first trenches 201 are formed in the process explained with reference to FIG. 10C, and the second trenches 202 are formed later. For example, the second trenches 202 are formed in the process that forms the contact holes 301 shown in FIG. 10G.

Figure 11A:
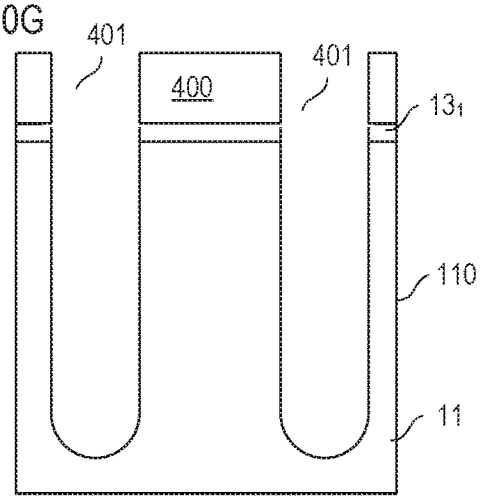
FIGS. 11A-11D illustrate one example of a method for forming a field electrode dielectric and a field electrode of a transistor device of the type shown in FIGS. 1 and 2, according to an embodiment.
Figure 11B:
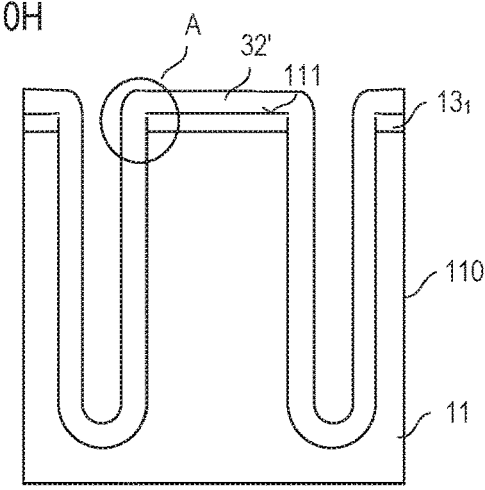

FIGS. 11A-11D show one example of a method for forming the field electrode structures in the first semiconductor layer 110. Referring to FIG. 11A, the method includes etching trenches 401 into the surface 111 of the first semiconductor layer 110. Referring to FIG. 11B, the method further includes forming a dielectric layer 32' on sidewalls and a bottom of the trenches 401 and on the first surface 111 of the first semiconductor layer 110. According to one example, forming this dielectric layer 32' includes depositing the dielectric layer 32'. According to another example, forming this dielectric layer 32' includes an oxidation process. According to yet another example, forming this dielectric layer 32' includes an oxidation process to form a first sublayer of the dielectric layer 32', and a deposition process to form a second sublayer of the dielectric layer 32' on the first sublayer.

Figure 11C:
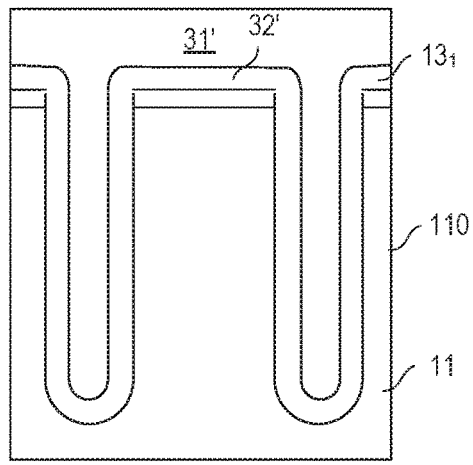

Referring to FIG. 11C, the method further includes forming an electrode layer 31' on the dielectric layer 32' such that the electrode layer 31' completely fills residual trenches that remain after forming the dielectric layer 32'. According to one example, the electrode layer 31' is not only formed in the residual trenches but also above the dielectric layer 32' above the surface 101 of the first semiconductor layer 110.

Figure 11D:
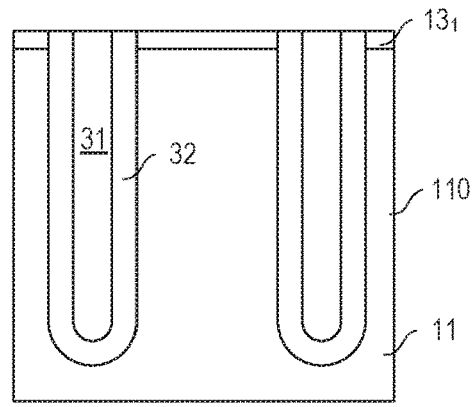

Referring to FIG. 11D, the method further includes removing the electrode layer 31' and the dielectric layer 32' above the surface 111 of the first semiconductor layer 110, so as to form the field electrodes 31 and the field electrode dielectric 32. Removing the electrode layers 31' and the dielectric layer 32' above the surface 111 may include at least one of an etching process, a mechanical polishing process, or a chemical-mechanical polishing process (CMP).

Figure 12A:
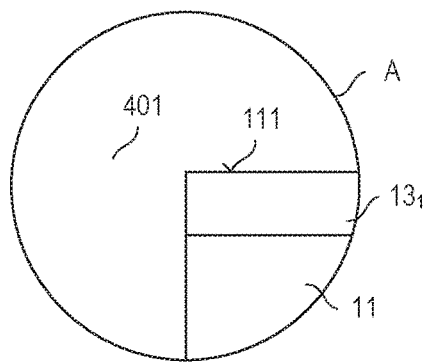
FIGS. 12A-12C illustrate one example of the method step shown in FIG. 11B in greater detail, according to an embodiment.
Figure 12B:
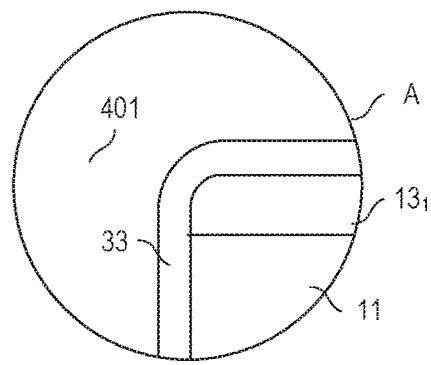
Figure 12C:
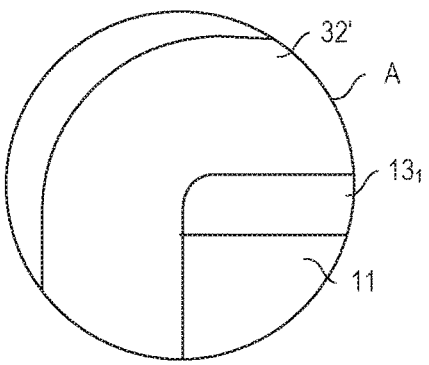

According to one example, a sacrificial layer is formed and removed before forming the dielectric layer 32'. This is explained with reference to FIGS. 12A-12C, that shows a detail A (see FIG. 11B), of the semiconductor layer 110 during the process of forming the dielectric layer 32'. FIG. 12A shows the detail A before forming the dielectric layer 32'. Referring to FIG. 12B, the method includes forming an oxide layer 33 by thermally oxidizing the semiconductor body 100. This thermal oxidation process causes corners of the trenches 401 between the first surface 111 and the sidewalls of the trenches 401 to be rounded. According to one example, a temperature in this oxidation process is higher than 1000° C., and may be in a range of between 1000° C. and 1100° C. Referring to FIG. 12C, the method further includes removing this oxide layer 33 and forming the dielectric layer 32'. The dielectric layer 32' can be formed as explained above. The oxide layer 33 can be removed by etching the oxide layer 33.

Figure 13A:
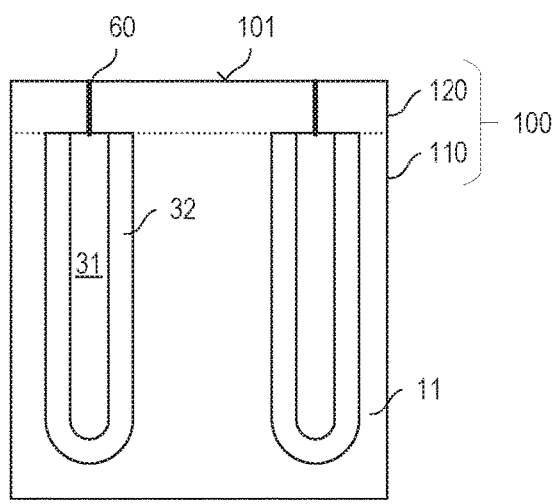
FIGS. 13A-13C illustrate one example of a method for forming a body region and a source region in a transistor device of the type shown in FIGS. 1 and 2.
Figure 13B:
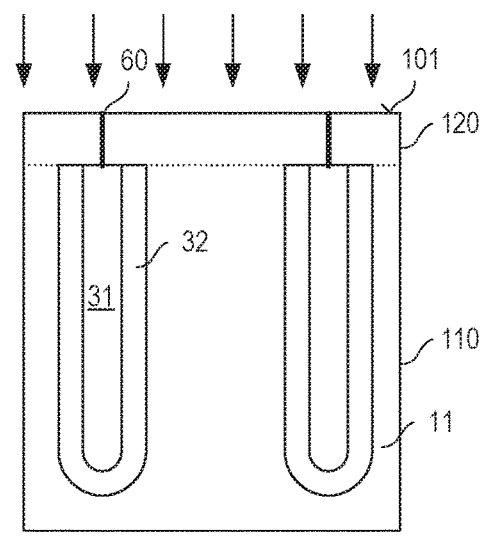
Figure 13C:
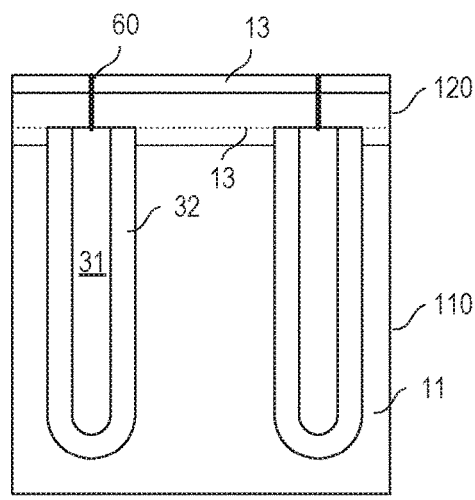

In the method explained with reference to FIGS. 10A-10H above, at least the second section of the body region $13_2$ is formed during the epitaxial growth process of the second layer 120. The first section $13_1$ may also be formed in this process by diffusing dopant atoms into the first layer, or may be formed before epitaxially growing the second semiconductor layer 120. The source region 12 may be formed during the epitaxial growth process of the second layer 120, or may be formed by introducing dopant atoms into the second semiconductor layer 120 after the epitaxial process. This, however, is only an example. According to another example, shown in FIG. 13A, the first semiconductor layer 110 is produced to have a basic doping corresponding to a desired doping concentration of the drift region 11, and the second semiconductor layer 120 is either formed as an undoped (intrinsic) layer or as a layer having a doping concentration corresponding to the basic doping of the drift region 11. Referring to FIGS. 13B and 13C, the source region 12 and the body region 13 are then formed by implanting dopant atoms via the surface 101 into the semiconductor body 100, and by diffusing and/or activating the implanted dopant atoms. Implanting the dopant atoms includes implanting dopant atoms of the doping type of the body regions 13 and implanting dopant atoms of the doping type of the source region 12. The dopant atoms of the body region 13 may be implanted deeper into the semiconductor body 100 than the dopant atoms of the source region 12. The implanted dopant atoms of the body region 13 and the source region 12 may be activated in one and the same annealing process or in different annealing processes.

Referring to FIGS. 1-3 and 10A-10G, the body region 13 is produced to extend below an upper surface of the field electrode 31 and the field electrode dielectric 32, respectively, as seen from the first surface 101. The "upper surface" of the field electrode 31 and the field electrode dielectric 32 is the surface facing the first surface 101 of the semiconductor body. By this, the pn-junction between the body region 13 and the drift region 11 is below the upper surface of the field electrode 31 and the field electrode dielectric 32. Referring to the above, a depletion region expands in the drift region 11 when the transistor device is blocking. This depletion region not only expands in the drift region 11, but also in the body region 13. As the body region 13 is higher doped than the drift region 11 the depletion region expands less deep into the body region 12 than into the drift region. According to one example, a doping concentration of the body region 13 and a distance of the pn-junction to the upper surface of the field electrode 31 and the field electrode dielectric 32 are adjusted such that the depletion region in the body region 13 does not reach the upper surface of the field electrode 31 and the field electrode dielectric 32, when a voltage equal the voltage blocking capability is applied in the off-state. By this a generation of charge carriers at traps at the upper surface of the field electrode dielectric 32 can be prevented. Those traps may be generated when the field electrode dielectric 32 is overgrown in the epitaxial process.

Alternatively or additionally to producing the body region 13 such that it extends to below the upper surface of the field electrode dielectric 32, a doped region forming a pn-junction with the drift region is formed such that it covers the upper surface of the field electrode dielectric 32 and extends to below the upper surface of the field electrode dielectric 32, as seen from the first surface 101.

Figure 14A:
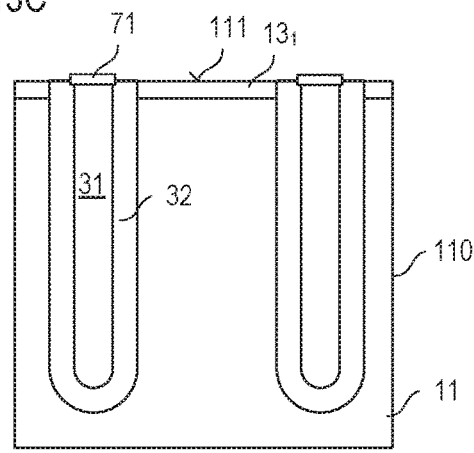
FIGS. 14A-14C illustrate a modification of the method step shown in FIG. 10B, according to an embodiment.
Figure 14B:
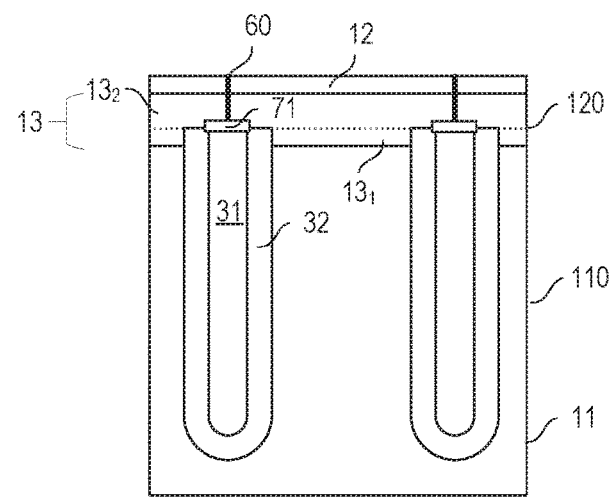
Figure 14C:
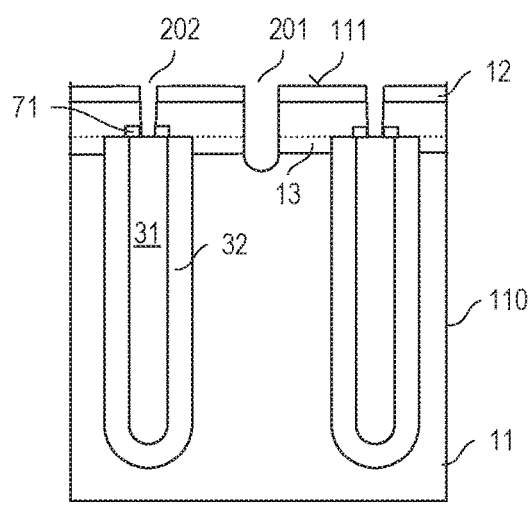

FIGS. 14A-14C show a modification of the process sequence explained with reference to FIGS. 10A-10C. In this modification, a protection layer 71 is formed on each of the field electrodes 31 before forming the second semiconductor layer 120. This protection layer 71 prevents the semiconductor layer 120 from growing on the field electrodes 31. For example, such protection layer 71 is formed on the field electrodes 31 in those cases, in which the field electrodes 31 include a polycrystalline semiconductor material. According to one example, the protection layer 71 is an oxide layer. Forming this oxide layer may include thermally oxidizing the field electrodes 31 and the surface 111 of the first semiconductor layer 110, and removing the oxide layer from the surface 111 in an etching process that uses an etch mask (not shown). The etch mask covers the protection layers 71 and protects the protection layers 71 from being etched.

Referring to FIG. 14B, the method includes forming the semiconductor layer 120. With regard to forming the second semiconductor layer 120 reference is made to FIG. 10B and corresponding description.

Referring to FIG. 14C, the first and second trenches 201, 202 are formed as explained with reference to FIG. 10C herein above. In this process, the second trenches 202 are etched through the protection layer 71 down to the field electrode 31.

Figure 15:
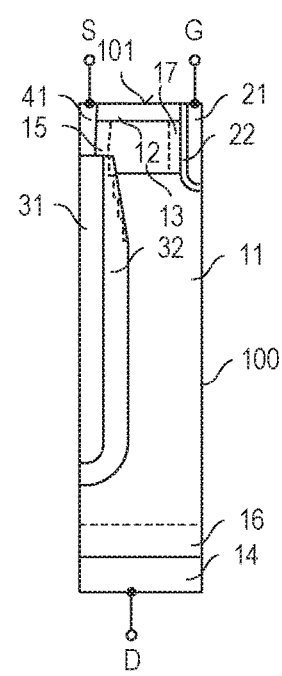
FIG. 15 shows a vertical cross sectional view of one transistor cell, according to an embodiment.

FIG. 15 shows a vertical cross sectional view of one transistor cell according to another example. In this example, a thickness of the field electrode dielectric 32 decreases towards the first surface 101, which may help to further decrease the pitch. In the example shown in FIG. 15, the thickness decreases continuously. This, however, is only an example. According to another example (illustrated in dashed lines) the thickness reduces stepwise.

The invention claimed is:

1. A transistor device comprising at least one transistor cell, wherein the at least one transistor cell comprises:
   a source region, a body region and a drift region in a semiconductor body;
   a gate electrode dielectrically insulated from the body region by a gate dielectric;
   a field electrode dielectrically insulated from the drift region by a field electrode dielectric; and
   a contact plug arranged between a first surface of the semiconductor body and the field electrode and adjoining the source region and the body region,
   wherein the field electrode and the field electrode dielectric are disposed in a field electrode trench that vertically extends into the semiconductor body,
   wherein a portion of the semiconductor body is arranged between the field electrode trench and the first surface of the semiconductor body, and
   wherein the portion of the semiconductor body that is arranged between the field electrode trench and the first surface comprises the body region, and wherein the body region directly contacts an upper surface of the field electrode dielectric,
wherein the upper surface of the field electrode dielectric extends transversely to a sidewall of the field electrode trench.

2. The transistor device of claim 1, wherein the body region comprises a contact region that is more highly doped than a remainder of the body region and adjoins the contact plug.

3. The transistor device of claim 1, wherein the gate electrode and the field electrode overlap in a vertical direction of the semiconductor body.

4. The transistor device of claim 3, wherein a shortest distance between the field electrode dielectric and the gate dielectric in a lateral direction of the semiconductor body is smaller than 150 nanometers.

5. The transistor device of claim 1, wherein the gate electrode and the field electrode do not overlap in a vertical direction of the semiconductor body.

6. The transistor device of claim 5, wherein at least the gate dielectric overlaps the field electrode dielectric in a lateral direction of the semiconductor body.

7. The transistor device of claim 1, wherein the field electrode and the field electrode dielectric are arranged in a needle shaped trench.

8. The transistor device of claim 1, wherein the contact plug comprises an electrically conducting barrier layer on the field electrode and the semiconductor body, and an electrically conducting layer on the electrically conducting barrier layer.

9. The transistor device of claim 8, wherein the electrically conducting barrier layer comprises titanium and/or titanium nitride, and wherein the electrically conducting layer on the electrically conducting barrier layer comprises tungsten.

10. The transistor device of claim 1, wherein the gate electrode is disposed in a first trench formed in a semiconductor layer, and wherein the contact plug is disposed in a second trench formed in the semiconductor layer.

11. The transistor device of claim 10, wherein the first trench overlaps the field electrode dielectric in a lateral direction of the semiconductor body.

12. A transistor device comprising at least one transistor cell, wherein the at least one transistor cell comprises:
a source region, a body region and a drift region in a semiconductor body;
a gate electrode dielectrically insulated from the body region by a gate dielectric; and
a field electrode dielectrically insulated from the drift region by a field electrode dielectric,
wherein in a lateral direction of the semiconductor body a shortest distance between the field electrode dielectric and the gate dielectric is smaller than 150 nanometers,
wherein the field electrode and the field electrode dielectric are disposed in a field electrode trench that vertically extends into the semiconductor body,
wherein a portion of the semiconductor body is arranged between the field electrode trench and a first surface of the semiconductor body, and
wherein the portion of the semiconductor body that is arranged between the field electrode trench and the first surface comprises the body region, and wherein the body region directly contacts an upper surface of the field electrode dielectric, and
wherein the upper surface of the field electrode dielectric extends transversely to a sidewall of the field electrode trench.

13. The transistor device of claim 12, wherein the gate dielectric overlaps the field electrode dielectric in the lateral direction.

14. The transistor device of claim 12, further comprising a contact plug arranged between the first surface of the semiconductor body and the field electrode and adjoining the source region and the body region.

15. The transistor device of claim 14, wherein the body region comprises a contact region that is more highly doped than a remainder of the body region and adjoins the contact plug.

16. The transistor device of claim 14, wherein the contact plug comprises an electrically conducting barrier layer on the field electrode and the semiconductor body, and an electrically conducting layer on the electrically conducting barrier layer.

17. The transistor device of claim 16, wherein the electrically conducting barrier layer comprises titanium and/or titanium nitride, and wherein the electrically conducting layer on the electrically conducting barrier layer comprises tungsten.

18. The transistor device of claim 12, wherein the field electrode and the field electrode dielectric are arranged in a needle shaped trench.

19. A transistor device comprising at least one transistor cell, wherein the at least one transistor cell comprises:
a source region, a body region and a drift region in a semiconductor body;
a gate electrode dielectrically insulated from the body region by a gate dielectric;
a field electrode dielectrically insulated from the drift region by a field electrode dielectric; and
a contact plug arranged between a first surface of the semiconductor body and the field electrode and adjoining the source region and the body region,
wherein the field electrode and the field electrode dielectric are disposed in a field electrode trench that vertically extends into the semiconductor body,
wherein a portion of the semiconductor body is arranged between the field electrode trench and the first surface of the semiconductor body, and
wherein the portion of the semiconductor body that is arranged between the field electrode trench and the first surface comprises the body region, and wherein the body region directly contacts an upper surface of the field electrode dielectric,
wherein the body region has an opposite doping type as the source region.

20. The transistor device of claim 19, wherein the source region and the drift region have a first conductivity type, and wherein the body region has a second conductivity type that is opposite from the first conductivity type.

21. The transistor device of claim 19, wherein the body region comprises a contact region that is more highly doped than a remainder of the body region and adjoins the contact plug.

22. The transistor device of claim 19, wherein the gate electrode and the field electrode overlap in a vertical direction of the semiconductor body.

23. The transistor device of claim 22, wherein a shortest distance between the field electrode dielectric and the gate dielectric in a lateral direction of the semiconductor body is smaller than 150 nanometers.

24. The transistor device of claim 19, wherein the gate electrode and the field electrode do not overlap in a vertical direction of the semiconductor body.

25. The transistor device of claim 24, wherein at least the gate dielectric overlaps the field electrode dielectric in a lateral direction of the semiconductor body.

26. The transistor device of claim 19, wherein the field electrode and the field electrode dielectric are arranged in a needle shaped trench.

27. The transistor device of claim 19, wherein the contact plug comprises an electrically conducting barrier layer on the field electrode and the semiconductor body, and an electrically conducting layer on the electrically conducting barrier layer.

28. The transistor device of claim 27, wherein the electrically conducting barrier layer comprises titanium and/or titanium nitride, and wherein the electrically conducting layer on the electrically conducting barrier layer comprises tungsten.

29. The transistor device of claim 19, wherein the gate electrode is disposed in a first trench formed in a semiconductor layer, and wherein the contact plug is disposed in a second trench formed in the semiconductor layer.

30. The transistor device of claim 19, wherein the first trench overlaps the field electrode dielectric in a lateral direction of the semiconductor body.

\* \* \* \* \*